United States Patent [19]

de Rudnay

[11] 4,385,080

[45] May 24, 1983

[54] METHOD FOR EVAPORATING LARGE QUANTITIES OF METALS AND SEMICONDUCTORS BY ELECTROMAGNETIC LEVITATION

[76] Inventor: Andre de Rudnay, Chateau de Valency, Lausanne, Switzerland

[21] Appl. No.: 180,005

[22] Filed: Aug. 21, 1980

[30] Foreign Application Priority Data

Aug. 22, 1979 [DE] Fed. Rep. of Germany ....... 2934011

[51] Int. Cl.³ ............................................. B05D 3/14
[52] U.S. Cl. ................................... 427/47; 427/250; 427/255.2
[58] Field of Search ...................... 427/47, 250, 255.2

[56] References Cited

PUBLICATIONS

Popular Mechanics Oct. 1952, vol. 98 #4, 427–447, "Metal Floats in Air . . . ", p. 86.

*Primary Examiner*—Bernard D. Pianalto
*Attorney, Agent, or Firm*—Hill, Van Santen, Steadman, Chiara & Simpson

[57] ABSTRACT

The invention relates to a method for evaporating large quantities of metals and semiconductor material by electromagnetic levitation, in which levitated evaporand is heated to evaporation by electrical means, particularly induction heating. To minimize precipitation of the evaporated material on parts of an electromagnetic coil means, these parts are heated due to proximity with coils of the coil means to evaporate liquid condensate deposits formed on the parts. The liquid condensate deposits are then returned into the evaporand by electromagnetic forces arising from the coil means, or gravitational forces or a combination of these forces. According to one embodiment of the invention, screens are placed between the electrical coil exposed to the vapor of the evaporated material and levitated evaporand. The condensate formed upon the screens is heated by induction, radiation, heat of condensation, or resistance heating or a combination to them.

9 Claims, 8 Drawing Figures

METHOD FOR EVAPORATING LARGE QUANTITIES OF METALS AND SEMICONDUCTORS BY ELECTROMAGNETIC LEVITATION

BACKGROUND OF THE INVENTION

1. Field of the Invention

The invention relates to a method and to a device for evaporating large quantities of metals and semiconductor materials by electromagnetic levitation, in which the levitating evaporand is heated to evaporation by electrical means and vapor condensate on parts of the electrical means or on screens thereof is caused to melt off so that melted off condensate is deposited into the levitating evaporand by electromagnetic field forces acting upon it.

2. The Prior Art

It is known that large quantities of metals such as Al, Ag, Au, etc., or metallic compounds such as CrNi, or semiconductors such as Si can be evaporated from web coating, plastic and metal parts coating, etc. onto moving or stationary targets. The evaporand is usually contained in one or several resistance heated boats or crucibles, in particular to boat-shaped slabs provided with a cavity and made of a high melting point metal or of a mixture of high melting point inorganic compounds. The evaporand placed into the boat or crucible is first melted, and then brought to evaporation temperature, the latter usually exceeding by several hundred degrees C the melting point of the evaporand.

As an example, Al has a melting point of 660° C., the boats used for its evaporation are usually made of sintered $AlN + BN + TiB_2$ and are heated to 1450°–1500° C. in commercial web coating units. Ag melts at 961° C., Au at 1063° C., the crucibles or boats made for their evaporation are usually made of W and have to be heated to approximately 2000° C. in order to achieve sufficiently fast evaporation for industrial use.

The high temperatures required for industrial evaporation result in a relatively short life of the evaporators used. They usually do not last more than 15 to 20 hours of effective evaporation. The number of hours could be increased by decreasing the temperature by several hundred degrees; however, lowering the temperature also decreases the speed of evaporation below that required by the industry. Nor can—as often required—efficient evaporation take place under these conditions at pressures exceeding a few tenths of a micron.

Induction heated crucibles of graphite are also being used, their inner wall coated with BN or TiC. Both coatings offer a temporary protection only against the corrosive action of reactive metals such as Al heated to evaporation temperature. Graphite crucibles also have the disadvantage that the co-evaporating carbon produces the undesirable, foul smelling, hygroscopic compound AlC in the condensed Al layer. It has therefore been tried to replace graphite crucibles with ceramic crucibles made of such electrically non-conducting materials as AlN or BN for the evaporation of Al, or made of $Al_2O_3$ for the evaporation of Ag, etc. With these crucibles, the evaporand is directly heated by electron bombardment or by eddy currents generated by an induction or work coil. However, even this type of crucible has various disadvantages, chief among them the short life due to the corrosion and erosion caused by high temperature evaporands in direct contact with the ceramic crucible. The same applies to submerged resistor furnaces that are known to be suitable for induction melting of metals, but not for their evaporation which require considerably higher temperatures in the upper part of the furnace.

In addition to their short life, presently used evaporators also suffer from the disadvantage that those parts of the evaporator that do not actively contribute to the evaporation process, i.e. the sides and the bottom of resistance heated boats and also the unwetted inner part and upper rim of e.g. an induction heated crucible, are sources of unwanted radiated heat. This heat is particularly intensive on account of the high emissivity of many of the materials the boats or crucibles are made of. In order to protect heat sensitive targets such as plastics, lacquered paper, etc. from harmful effects of the radiated heat, the evaporator-to-target distance usually equals 100 mm or more. Yet such a considerable distance causes the efficiency, i.e. the percentage of the evaporated metals effectively condensed on the target, to drop to low values, mostly in the order of 30% only, the rest of the evaporated metals or semiconductors being lost on recipient walls and requiring frequent and expensive cleaning.

On the other hand, levitation by electromagnetic forces, coupled with high frequency heating to evaporation temperature, offers the double advantage of exceptional evaporator life and having heat radiated by the levitating evaporand only. According to this method, described by O. Muck in his German Pat. No. 422 004, an electrical conductor is levitated in molten or solid state by the action of electromagnetic forces and can be simultaneously brought to evaporation. Yet a considerable part of the vapor given off by the evaporand condenses on the induction or work coil that induces levitation, so that the latter requires cleaning at frequent intervals. Thus, J. van Audenhove reports in his article: "Vacuum Evaporation of Metals by High Frequency Levitation Heating", J.Sci.Instr., Vol. 36, Mar. 1965, 383–385, that approximately 50% of the evaporated metals condensed on a water cooled work coil and had to be stripped off after breaking the vacuum. It is evident that such condensation, unless prevented in time, does not permit evaporation over several hours.

The present invention is directed to a new method and device for evaporating an evaporand consisting of conducting materials such as metals and semiconductors. The inventive method and device uses the known technique of levitating an evaporand by means of a work coil which may be provided with a boat or other hollow-shaped body. The method includes heating the evaporand to evaporation temperature by electrical means, and also providing for the added new feature of preventing the lasting condensation of the evaporand vapor on said work coil and other parts it has been equipped with. A further new feature of the invention is that very low vapor pressure heavy additives such as tungsten can be added to volatile and lighter weight evaporand such as aluminum, so as to increase the efficiency of high frequency induction heating.

SUMMARY OF THE INVENTION

According to the invention, parts of an electromagnetic levitation device that have to be protected from lasting deposits formed by the vapor given off by the evaporand, in particular the parts or shields of the work coil facing or covering the evaporand, will be heated to a temperature that will be higher than the melting temperature of the condensed molecules, but preferably much lower than the temperature of the levitating evaporand. In this way, those parts of a work coil inducing levitation that have so far been covered and made useless by condensing thick deposits, will be kept substantially free and fit for continued operation.

The temperatures required in or on the parts to be protected from condensation, are produced by many different ways such as induction heating due to the work coil, radiation heating due to the levitating evaporand, heat of condensation given off by the condensing molecules, independent resistance heating, etc., or by a combination of several heating methods. In all cases, the condensing vapor of the evaporand forms electrically conducting films or droplets that are stripped off the parts of the device by gravity or by electromagnetic forces or by the simultaneous action of several forces. The stripped off films or droplets are subjected to electromagnetic forces responsible for levitating the evaporand, so that they rejoin the levitating evaporand their molecules came from.

In this way, growth of undesirable condensates will be prevented and the temperature required for doing so will in most cases be considerably below that required for evaporation. In view of the fact that the corrosion resistance of the materials usually found in conventional evaporators is inversely proportional to temperature, it is evident that such materials will last longer when used in combination with the new method and device subject of the invention.

Another advantage of the new method and device is the possibility of adding desirable additives to the levitating evaporand, e.g. low vapor pressure additives that do not co-evaporate and therefore do not condense on the parts to be kept free, but increase the specific resistivity or weight or both of the melt levitated by the work coil and thereby increase the coil's heating efficiency.

The evaporator parts not directly participating in the coating process, may be screened to make it possible to place the new evaporators closer to heat sensitive materials that will in consequence receive a higher proportion of the evaporated vapor with less of the vapor condensing on other system components such as chamber walls, etc. so as to require less frequent cleaning. For the same reason, coating speed can be increased while evaporating the same quantity of vapor into the coating system, and pressure requirements of a vacuum evaporating system can be reduced, i.e. higher residual gas pressures allowed during the evaporation process. Also, feeding of the levitating evaporand can proceed from below, instead of the conventional wire feed directed towards the upper surface of a boat or crucible-shaped evaporator generally used in existent industrial coating systems. Bottom feed also reduces the danger of particles being thrown off by the melting wire or rod.

With respect to coating plant construction, particularly air-to-air vacuum coating plants, increased operational safety can be had in most of the embodiments of the invention subject to such operational hazards as current failure. In fact, current failure and subsequent pressure rise in an air-to-air vacuum coating plant cause irreparable damage to hot conventional evaporators, whereas it simply drops the levitating evaporand into a water-cooled container that can be positioned under the evaporand.

DESCRIPTION OF THE PREFERRED EMBODIMENT

Figure 1:
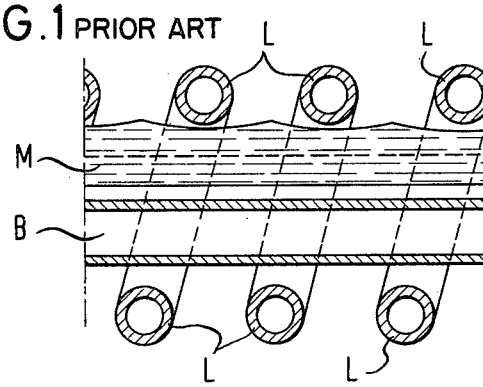
FIG. 1 schematically illustrates a side elevation cross-section of a conventional induction heated melting and-/or evaporating device in industrial use; the melt or molten evaporand is levitated by electromagnetic forces generated by the work coil, and the device is also currently used for zone refining.

The following examples will show how an electrical coil, in accordance with the present invention, produce both electromagnetic levitation and induction heating of a selected evaporand, simultaneously preventing the incident vapor molecules from permanently condensing and thereby forming thick condensed layers on parts of the work coil. To facilitate understanding, equations relating to induction heating, as published in the manual "Hochfrequenz-Industrie-Generatoren" (Industrial High Frequency Generators), edited by VALVO, and printed by Boysen & Maasch, 2000 Hamburg, 1, 31 Hermanstrasse in the year 1975, are set forth as follows.

List of Symbols:
$A$ = cross section of the work coil in $cm^2$
$A_L$ = cross section of the object being heated in $cm^2$
$D$ = diameter of the work coil in cm
$d$ = diameter of the object being heated in cm
$\delta$ = skin depth in cm (calculated for the maximum temperature to be reached)
$\eta_L$ = efficiency of the work coil
$f$ = frequency in cycles per second (Herz)
$I$ = current in the work coil
$L$ = length of the work coil in cm
$l$ = length of the object being heated in cm
$m$ = mass of the work in g
$\mu$ = magnetic permeability of the material the work is made from n = number of work coil windings
n' = number of objects being heated over one cm length
P_W = power required in kW
$\rho_1$ = effected specific resistivity of the work material in microohm cm
$\rho_2$ = effective specific resistivity of the work coil material in microohm cm
S = specific heat of the work coil material in J/g K
t = heat up time in seconds (to which about 30% are to be added for losses)
$\theta$ = initial temperature of the work material in °C.
$\theta_2$ = maximum temperature of the work material in °C.
U/n = voltage on a single work coil winding $$\delta = 5.03 \sqrt{\frac{\rho_1}{\mu f}} \quad (1)$$

$$f_{min} = 16 \cdot 10^2 \frac{\rho_1}{\mu d^2} \quad (\text{or: } d_{min} = \delta \cdot 8) \quad (2)$$

$$\text{optimum coupling} = \frac{L}{D} = \frac{1}{d} = 1.5 \quad (3)$$

$$P_W = \frac{(\theta_2 - \theta_1) m S}{1000 \cdot t} \quad (4)$$

$$\eta_L = \frac{1}{1 + \frac{D^2}{d^2}\left(1 + 6.25 \frac{\delta^2}{d^2}\right)\sqrt{\frac{\rho_2}{\mu t}}} \quad (5)$$

$$n I_{rms} = \sqrt{\frac{P_W \delta \, l \, 10^9}{\pi \rho_1 d}} \quad (6)$$

$$\frac{U}{n} = 0.08 \, n' f \, I (A - A_L) 10^{-6} \quad (7)$$

FIG. 1 shows the longitudinal section of an induction heated levitation melting system described in the SIEMENS & HALSKE A.G. German Pat. No. 518 499 used for melting high melting point metal such as Ta, Th, W or their alloys, and currently used for melting, evaporation, and zone refining. The metallic melt M is levitated in a horizontal, water cooled boat B made of a single piece or of individual segments. Boat B is usually made of copper or silver. Instead of water other liquid coolants can also be used. When made of metal, it is generally assumed that boat B acts as a concentrator for the work coil L that usually consists of several windings. According to the German Pat. No. 518 499, the boat can also be made of a dielectric material such as SiO$_2$, etc. Experience shows that in a well designed and operated device of this kind, efficient melting, evaporation, and zone refining can be carried out, yet evaporated metal or semiconductor condenses on the upper part of the work coil L and makes it impossible to evaporate large quantities without frequent cleaning operations.

However, when using the inventions described hereinafter, large quantities of electrically conducting evaporands can be evaporated without frequent cleaning. The inventive improvements comprise a method and a device comprising the rejection of the vapor molecules that have so far condensed on the upper part of work coil L, and means for returning the rejected molecules, or at least a large part of them, into the levitated evaporand M they have come from.

Figure 2:
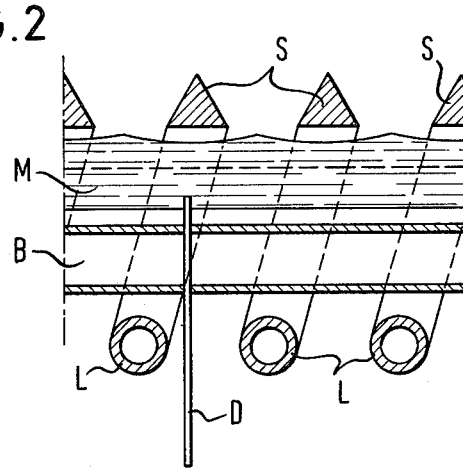
FIG. 2 schematically illustrates a side elevational cross-section of an evaporative device modified according to one of the embodiments of the invention such that those parts of the water cooled work coil that are placed between the levitating evaporand and the target to be vapor coated are in the form of heated sticks, the purpose of which is to reject condensing vapor molecules and thus to keep the respective part of the work coil free for continued evaporation of large quantities of metals or semiconductors.

A suitable device showing the suggested improvements is illustrated in FIG. 2. The construction of the evaporator shown in longitudinal section is similar to that illustrated in FIG. 1, identical parts being provided with identical symbols.

According to the invention, only the lower and side parts or sections of the work coil L are made of conventional liquid cooled low electrical resistivity material such as copper, while those parts or sections of the work coil windings that are above the levitated metal M, as made of solid lengths or sticks S the resistivity of which at the given working temperature is higher than that of the water cooled copper. The sticks also exhibit good corrosion resistance in contact with molten evaporand material. The cross section of the sticks schematically illustrated is triangular, but sticks having various other cross section can also be used; furthermore, they can be straight or bent, solid or hollow. Their cross section and specific resistivity are chosen as a function of the stick temperature desired, as well as of the work coil current required for heating the levitated evaporand N to evaporation temperature. The latter is as a rule considerably higher than stick temperature. Thus, an evaporand M consisting of Al will be induction heated to 1500° C. or more, while the temperature of the sticks S may be as low as 700° C., i.e. somewhat higher than the melting point of the evaporand. A levitated silver evaporand M must be heated to about 1900°–2000° C. for fast evaporation, while ⅔ of this temperature is largely sufficient for the repelling sticks S. By this new method, not only will the growth of vapor condensate on the work coil be prevented, but also the life of sintered products in contact with evaporand molecules, in this particular case the life of the sticks S, will considerably surpass the life of sintered boats made of the same material and heated by conventional means.

The use of heated sticks S offers two further advantages. Firstly, by making these heated sticks S of a material of an appropriate electrical resistivity, the efficiency of the upper part of the work coil and hence its magnetic flux lines can be decreased at will, and the drop can be calculated from equation (5). Decreasing the magnetic flux lines of the upper part of the work coil also decreases coupling to a nearby metallic object such as the leading drum of a continuous vacuum coating system, while the other parts of the work coil, not being exposed to the vapors of the evaporand M, can, if required, be enclosed into soft ferromagnetic material. Secondly, very high temperatures can be achieved in evaporand M by using the sticks S as cathodes in a discontinuous electron bombardment heating system wherein the levitated evaporand M is made the target.

In many cases it will be desirable or even necessary to raise the efficiency of the induction heating. This in accordance with the invention by increasing the specific resistivity $\rho_1$ of the evaporand M by adding very low vapor pressure additives such as W, Ta, etc. to a levitated melt characterized by low electrical resistivity. It is known that W, Ta, etc. form low-melting, high resistivity eutectica with several low resistivity metals such as Al, and that pure Al distills out of such eutectica on heating. It is also known, that the eutectica and alloys formed by very low vapor pressure heavy metals such as W, Ta, etc. with low-resistivity and high vapor pressure lighter metals such as Al, Be, etc. are characterized by higher specific weight than that of the distilled metal escaping from the eutecticoid or alloy on heating. Consequently, the new inventive process by which high vapor pressure, low resistivity, light or medium-weight metals can be evaporated out of a compound with higher resistivity and weight, increases both eddy current losses and coupling efficiency in induction heated levitated melts M, and the optimum proportion of the constituents can be readily determined by pyrometric measurements made under a noble gas such as A. Care should be taken to use frequencies $f$ high enough to minimize possible disturbances arising out of an ultimate skin depth greater than $\frac{1}{8}$ of the diameter of the levitated evaporand as shown in equation (2).

Figure 3:
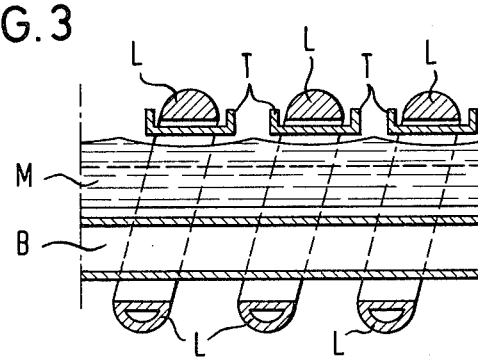
FIG. 3 is a schematic view of another embodiment of the invention comprising screens placed between the levitating evaporand and those parts of the work coil that have to be protected from vapor condensation.

A further embodiment of the invention is illustrated in FIG. 3 wherein symbols identical with those used in the preceding figures as well as in all successive figures have the same meaning. In this embodiment, precautions are being taken against undesirable electrical discharges that are known to set in particularly at frequencies exceeding about 100 kHz whenever the voltage rises above certain values determined by the ambient pressure as well as that of the evaporand's vapor. FIG. 3 shows a work coil L entirely consisting of a conductor such as copper or silver, covered by a thin electrical insulating layer (not shown) and protected by screens T placed between the levitated evaporand M. The upper part or section of the work coil L does not touch the screens T, so that the latter, preferably made of a suitable ceramic such as BN or AlN or $Al_2O_3$ or $AlN+BN+TiB_2$ or another heat resistant ceramic, can be efficiently heated by induction, radiated heat due to M, heat of condensation of the impending vapor molecules, or any other means sufficient to raise the temperature of T or that of the condensate formed upon it, to a temperature somewhat in excess of the melting temperature of the condensate. The melt thus formed, be it shaped as a molten layer or as individual droplets, will experience the centripetal force due to the electromagnetic field of work coil L, and therefore rejoin the levitated evaporand M.

Instead of the partial screens shown in FIG. 3, screens fully enveloping the parts of the work coil L exposed to vapor can be also used. In order to facilitate replacement of used tube-shaped screens, the upper part of the work coil L can be made of massive copper. Pancake-shaped multiturn coils made of massive or hollow, water cooled copper strips can be used and screened by a common screen for all windings comprising the pancake.

The work coil L can have shapes other than cylindrical. Toroidal shapes are known to have small external fields and are therefore particularly suitable for working in the immediate vicinity of metallic objects. Also, the inventive device is well suited for directing a vapor beam in the vertical or inverted direction. In fact, the centripetal action referred to above can be made strong enough, by suitably designing the work coil and its shield, to reject at a given field strength all conducting droplets and layers formed on screens T into the levitating evaporand M.

Figure 4:
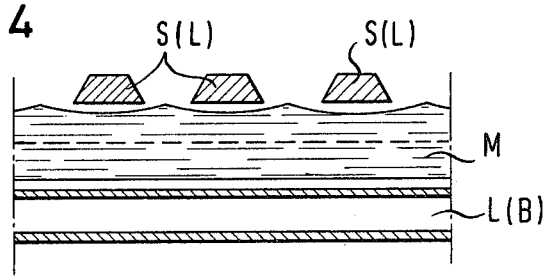
FIG. 4 illustrates yet another embodiment of the invention with the heated stick parts of trapezoidal cross section.

FIG. 4 illustrates the horizontal cross section of another embodiment of the inventive method and device. The cylindrical induction coil L consists of a single broad winding L(B) in its lower portion and several, spaced parallel windings S(L) in its upper part. The parallel windings can be made of heated sticks or cold tubes or massive conductors protected by screens, the latter also made of a single inorganic dielectric provided with slits or holes, and laid across coil L. The single board winding lower part L(B) of the coil L acts as a boat containing the evaporand levitated in immediate proximity of its inner shell. Several such evaporators can be assembled in series or line in which case the wire feed will preferably enter not through the broad bottom winding, but between individual evaporators assembled in line.

Figure 5:
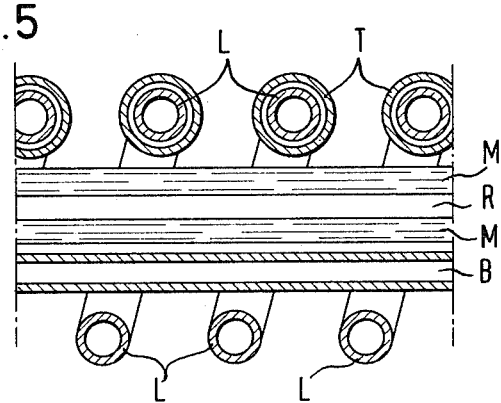
FIG. 5 shows a further embodiment of the invention with coil parts or sections surrounded by protective screens.

The embodiment illustrated in FIG. 5 shows in longitudinal section how the mass of the levitated evaporant M can be reduced by introducing a solid body R that can assume various forms and is enclosed by the levitated evaporand M. R can be made of a phase inverted induction coil that keeps evaporand M levitated as a molten tube between R and the outer induction coil L, or it can consist of a cylindrical body made of heat- and corrosion resistant ceramic. In the lastmentioned case, the device can be likened to an immersed resistor type induction heating furnace, but while the latter is characterized by a thick upper and thin lower melt section, the reverse is preferred in the evaporator arrangement of the present invention. The result is that the upper part of the levitated evaporant M assumes a higher temperature than the rest of it, so that corrosion and erosion effects are reduced.

In the preceding examples it has been shown how to prevent the growth of a thick condensed layer on those parts of an induction or work coil that are exposed to the vapor of the evaporand and are placed between the evaporand and the target or targets to be coated. In the following, further examples of the new method and device arrangement are given, characterized by unimpeded, free space between target and levitated evaporand.

Figure 6:
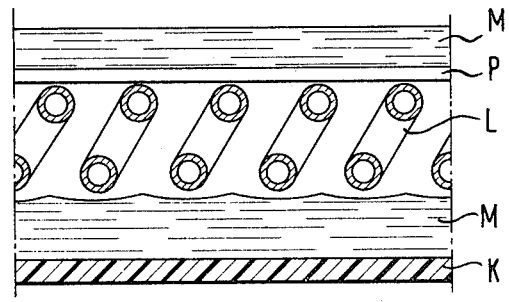
FIG. 6 schematically illustrates an embodiment of the invention in which the work coil is placed within the melt, in a manner resembling so-called submerged resistor furnaces.

FIG. 6 illustrates the longitudinal section of a device for use as submerged resistor type induction furnace operated with a soft magnetic core at relatively lower frequencies, without a core operating at higher frequencies. The bottom of the melt i.e. of the evaporand M is thinner than its evaporating top that is in consequence heated to higher temperature. Contrarily to the device illustrated in FIG. 5, the present device does not have an external work coil. The interior work coil L of FIG. 6 pushes the bottom of the evaporand M against a ceramic container wall K. However, the latter is not contacted by the top, i.e. heated suction or part of the evaporand M, so erosion is consequently reduced and the life of the ceramic container or boat K extended. Work coil L is placed in a ceramic tube (not shown) that protects the work coil from condensing vapor, the condensate being melted and rejected into the levitated evaporand M. To ensure permanent electrical contact with the upper portion of the molten evaporand M, a temperature and corrosion resistant plate P, having an electrical conductivity lower than that of the molten evaporand M, can be fastened over the top of the ceramic tube enclosing the work coil L.

Figure 7:
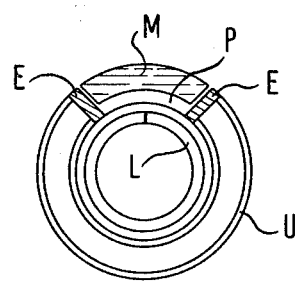
FIG. 7 shows a fragmentary schematic view of a modified version of the embodiment illustrated in FIG. 6, the lower part of the so-called submerged resistor replaced by a water-cooled copper conductor.

FIG. 7 is a cross-sectional view of a simplified, energy saving method and device repeating the main features of the previous example. The lower support of the molten evaporand M is replaced by a bent and hollow water cooled piece of copper U, the upper ends of which terminate in two heat and corrosion resistant electrodes E that hold between them the levitated molten evaporand M. Here again, a heat and corrosion resistant plate P caracterized by an electrical resistivity higher than that of the melt, e.g. a sintered ceramic plate containing refractory nitrides and borides, can be placed immediately above the ceramic tube (not shown) enclosing work coil L. As both electrodes E are firmly bolted to the water cooled copper legs U, the temperature of the electrodes E will remain below that of the levitated evaporand M into which vapor molecules condensed on plate P will be deposited by the centrifugal action of the electromagnetic field established by work coil L. Contraryly to the feeding of the evaporators illustrated in FIGS. 2–5 and 8, no wire or strip material can enter the levitated evaporand from below, but enters in the conventional way from above, or through an opening (not shown) in one or both electrodes E.

Figure 8:
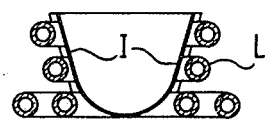
FIG. 8 schematically illustrates an embodiment of the invention in which the work coil axis is vertical.

Finally, FIG. 8 shows how a work coil having a vertical axis, a device useful for evaporating small quantities of metals and semiconductors by high frequency levitation heating, can be modified or completed to make it suitable for the evaporation of large material quantities. This can be done by adding to the work coil L a heat and corrosion resistant ceramic dish of shell I not cooled by direct contact with the water cooled copper tubing of the work coil nor heated to evaporation temperature as it is not filled by the evaporand (not shown) that is being kept levitated inside the ceramic shell the temperature of which is thus higher than the temperature of the work coil, but lower than that of the levitated evaporand. The vapor of the evaporand condensing on the inside of the shell I will thus be rejected by the radial forces due to work coil L, into the main mass of the levitated evaporand. To keep the ceramic shell or screen well centered, heat resistant inorganic fibres can be inserted between L and I. Contrarily to conventional levitation devices wherein high temperatures are difficult to achieve when levitating low resistivity metals of low or middle specific weight, the method described above of adding refractive metals and thus producing heavy and low conductivity levitated melts from which the lighter, low resistivity metals evaporate, is particularly suitable for the fast evaporation of large quantities of relatively volatile, low or middle weight metals such as Al, Be, Fe, Ni, etc.

Although various minor modifications may be suggested by those versed in the art, it should be understood that I wish to embody within the scope of the patent warranted hereon all such modifications as reasonably and properly come within the scope of my contribution to the art.

I claim:

1. A method for the evaporation of large quantities of metal and semiconductor from a liquid-state evaporand using an electromagnetic work coil means comprising:
   arranging said work coil means to form a magnetic field containing said evaporand in a state of levitation and induction heating for evaporating selective volatile material from said evaporand,
   cooling said work coil means below its melting temperature,
   providing parts along said work coil means directly exposed to said evaporated material,
   heating said parts to a temperature less than the evaporation temperature of said evaporated material but greater than or equal to the melting temperature of said evaporated material such that evaporated material condenses to liquid state on said parts, and
   directing thus condensed material from said parts back into said evaporand with electromagnetic forces produced by said work coil means.

2. The method of claim 1, wherein said parts comprise screen means disposed between said evaporand and said work coil means.

3. The method of claim 1, further comprising:
   forming said evaporand with material non-volatile at the evaporation temperature of said evaporated material along with said volatile material being evaporated and
   replacing evaporated volatile material in said evaporand by a feed means delivering the volatile material to said evaporand.

4. The method of claim 3, wherein said feed means delivers volatile material in the form of a wire.

5. The method of claim 1, wherein said work coil means surrounds said evaporand.

6. A method for evaporating large quantities of metal and semiconductor from a liquid-state evaporand using an electromagnetic work coil means comprising:
   levitating and induction heating said evaporand within a magnetic field formed by said work coil means for evaporating selective material molecules from said evaporand,
   providing parts along said work coil means within said magnetic field exposed to said evaporated molecules,
   heating said parts to temperatures causing evaporated molecules adjacent said parts to liquefy but not permanently condense on said parts, and
   rejecting thus liquefied molecules back into said evaporand from said parts under the influence of said magnetic field, whereby molecules evaporated from said evaporand are prevented from permanently condensing on said work coil means.

7. The method of claim 6, further comprising:
   forming said evaporand with material molecules essentially non-volatile at the evaporation temperature of said evaporated molecules along with volatile material molecules to be evaporated and
   replacing the volatile material molecules evaporated out of said evaporand by means of a feed means delivering the volatile material to said evaporand.

8. The method of claim 7, wherein said feed means delivers said volatile material in the form of a wire.

9. The method of claim 6, wherein said parts comprise screen means disposed between said evaporand and said work coil means.

* * * * *